United States Patent
Tsuboi

(10) Patent No.: US 7,053,952 B2
(45) Date of Patent: May 30, 2006

(54) IMAGE PICKUP APPARATUS

(75) Inventor: Takayuki Tsuboi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 725 days.

(21) Appl. No.: 10/242,703

(22) Filed: Sep. 13, 2002

(65) Prior Publication Data

US 2003/0063210 A1    Apr. 3, 2003

(30) Foreign Application Priority Data

Sep. 18, 2001    (JP) ............................. 2001-283192

(51) Int. Cl.
*H04N 5/225* (2006.01)
*H01L 31/232* (2006.01)
(52) U.S. Cl. ...................... 348/340; 257/436
(58) Field of Classification Search .............. 348/340, 348/335; 257/291, 436
See application file for complete search history.

(56) References Cited

U.S. PATENT DOCUMENTS 5,172,206 A * 12/1992 Iizuka ....................... 257/291
5,262,667 A * 11/1993 Hirai ........................ 257/435
5,790,193 A *  8/1998 Ohmori ..................... 348/375
6,137,535 A * 10/2000 Meyers ..................... 348/340

FOREIGN PATENT DOCUMENTS

JP    3-283572    12/1991

\* cited by examiner

*Primary Examiner*—Ngoc-Yen Vu
*Assistant Examiner*—Adam L. Henderson
(74) *Attorney, Agent, or Firm*—Fitzpatrick, Cella, Harper & Scinto

(57) ABSTRACT

There is provided an image pickup apparatus which has a plurality of photoelectric conversion regions and a plurality of reflectors disposed so as to lie around the photoelectric conversion regions when viewed from the light incident direction, and which is constructed such that each reflector reflects at least one part of the light from one of the photoelectric conversion regions towards one of the other photoelectric conversion regions adjacent to the one photoelectric conversion region.

9 Claims, 10 Drawing Sheets

IMAGE PICKUP APPARATUS

BACKGROUND OF THE INVENTION

1. Field of the Invention

The present invention relates to an image pickup apparatus for imaging an object.

2. Description of the Related Art

Hitherto, a known solid-state imaging sensor represented by a CCD type has a lens-forming layer formed on a chip for increasing the amount of light incident on a sensor unit. The lens-forming layer is an inorganic or organic transparent material layer formed in, for example, a convex shape, and collects light by refracting it at the convex surface. The cross-sectional structure of the solid-state imaging sensor disclosed in Japanese Patent Laid-Open No. 3-283572 is shown in FIG. 9 by way of a typical example. FIG. 9 illustrates a part of the solid-state imaging sensor, which has a substrate 101, light-shielding electrode layers 102 formed on the substrate 101, and a sensor unit 104, facing the bottom of an aperture 103 of the electrode layers 102, for performing photoelectric conversion. The electrode layers 102 are covered by a planarizing layer 105, and the planarizing layer 105 has a dye layer 106 formed thereon serving as a color filter. The dye layer 106 has a lens-forming layer 107 formed thereon. The lens-forming layer 107 has a convex portion 108 opposed to the aperture 103 of the sensor unit 103. Light incident on the surface of this chip is refracted at the convex portion 108 and is guided to the sensor unit 104 lying on the surface of the substrate 101. Then, the light is converted to electricity so as to produce a desired image signal.

A low-pass filter will be described next. FIG. 10 illustrates a pixel array of a typical solid-state imaging sensor. Each circle depicted in the drawing represents an aperture of a corresponding microlens disposed in front of each pixel, in other words, an effective portion of light incident on the pixel. Since, in such a solid-state imaging sensor, a plurality of colors cannot be stacked color by color in the thickness direction thereof in a similar fashion to a silver film, the colors are arrayed in directions parallel to the surface thereof, that is, each pixel is assigned an individual color, so that the pixels practically receive only a corresponding single color. Accordingly, any color which is not assigned to the pixel is produced by computing the data of neighboring pixels to which different colors are assigned.

In FIG. 10, symbols R, G, and B represent color filters which allow only portions of light in the wavelength regions corresponding to red, green, and blue colors to pass therethrough, respectively, and these color filters are arranged in a staggered array, which is generally called a Bayer array. By using the solid-state imaging sensor arrayed as shown in FIG. 10, a color which is not assigned to one pixel is produced at the pixel such that, since the pixel has adjacent pixels to which other colors are assigned, a false signal is produced in accordance with the degree of similarity of luminance signals between, for example, the pixels above and below, or the pixels at the right and left and is then added to the signal of the one pixel. As a result of such a general arrangement, it is known that a false color signal, which should not be produced, is produced at regions such as the boundary between the black and white colors.

As a remedy, for example in a digital camera using such a solid-state imaging sensor for imaging a natural picture, the false color signal is removed by inserting a low-pass filter (hereinafter referred to LPF) between a pickup optical system and an the solid-state imaging sensor, since color tone gives a better impression than resolution when the natural picture is observed. The low-pass filter uses an artificial crystal called a Savart plate or the like, and simply shifts deflected components of light orthogonal to the traveling direction of the light to the side without providing a phase difference. By shifting the deflected components by a distance corresponding to the pitch of each pixel shown in FIG. 10, the low-pass filter generally prevents the generation of a false color. Since these deflected components are generally shifted in the X and Y directions in a plane orthogonal to the optical axis, two or three sheets of the above described crystal plates are inserted in different directions, for example, the X and Y directions and a direction at an angle of 45 degrees with respect to both the X and Y directions.

A product, such as a digital camera, using such solid-state imaging sensor requires further reduction in size of the advanced solid-state imaging sensor. However, if the efficiency of photoelectric conversion of the solid-state imaging sensor is fixed, simply reducing the size leads to a reduction in the amount of incident light, that is, to a reduced sensitivity, thereby causing a problem in that it is difficult to obtain an image having slight noise.

In the solid-state imaging sensor mentioned above, three types of color filters 106, each of which is generally assigned to each pixel, are alternately disposed. For example, in an advanced digital still camera, the color filters of three primary colors R, G, and B form the corresponding pixels arranged side-by-side in the Bayer array, that is, in an alternating manner, since color reproduction is important. However, in such color filters composed of dyes, since, when one filter is used for the color R, the filter cuts portions of light in the wavelength regions of the colors G and B, and the portions of the incident white light focusing toward the pixel of the filter for the color R are absorbed in the filter and are not converted into electricity. In other words, a pickup lens discards two thirds of light which is to be collected at each pixel.

Also, the LPF described above has two problems: a transparent crystal plate composed of an artificial crystal or the like is generally disposed behind the pickup optical system and in front of the solid-state imaging sensor, thus causing the pickup optical system to be thick, and also this component is expensive, thereby leading to an increased cost of a product including the LPF.

SUMMARY OF THE INVENTION

It is an object of the present invention to provide an image pickup apparatus which does not require an expensive optical low-pass filter and which provides a high definition image having slight moire fringes.

In addition, it is another object of the present invention to provide an image pickup apparatus which improves the utilization efficiency of incident light.

To achieve the above objects, an image pickup apparatus according to the present invention comprises a plurality of photoelectric conversion regions; a plurality of light entrance portions through which light is incident on the photoelectric conversion regions; and a plurality of reflectors. When viewed from the light incident direction, the reflectors are disposed in the regions where the light entrance portions do not exist, and each reflector reflects at least one part of light incident on one of the light entrance portions to one of the other entrance portions adjacent to the one light entrance portion.

This structure achieves an image pickup apparatus which does not require an expensive optical low-pass filter, provides a high quality image having slight moire fringes, and improves the utilization efficiency of incident light.

Further objects, features and advantages of the present invention will become apparent from the following description of the preferred embodiments with reference to the attached drawings.

DESCRIPTION OF THE PREFERRED EMBODIMENTS

Figure 1:
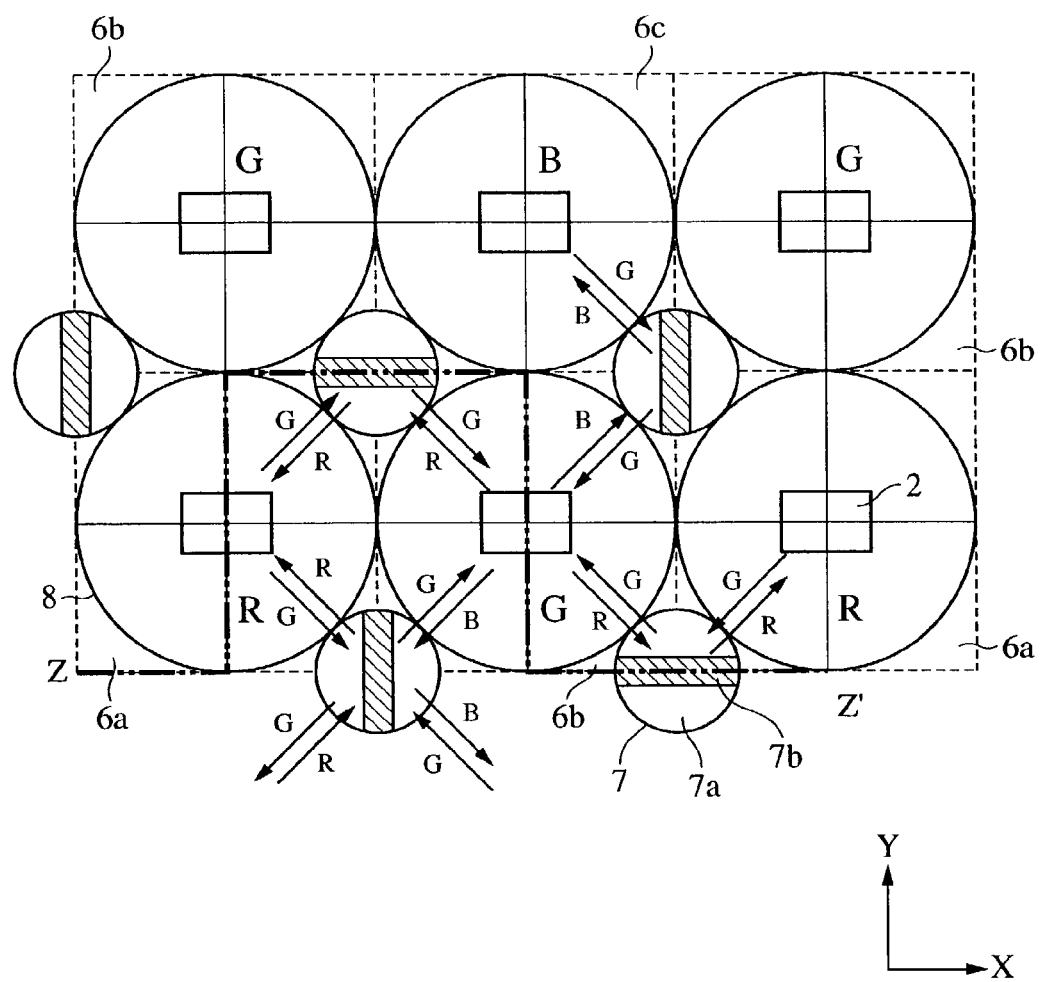
FIG. 1 is an enlarged partial view of a solid-state imaging sensor viewed from the light incident direction according to an embodiment of the present invention.
Figure 2:
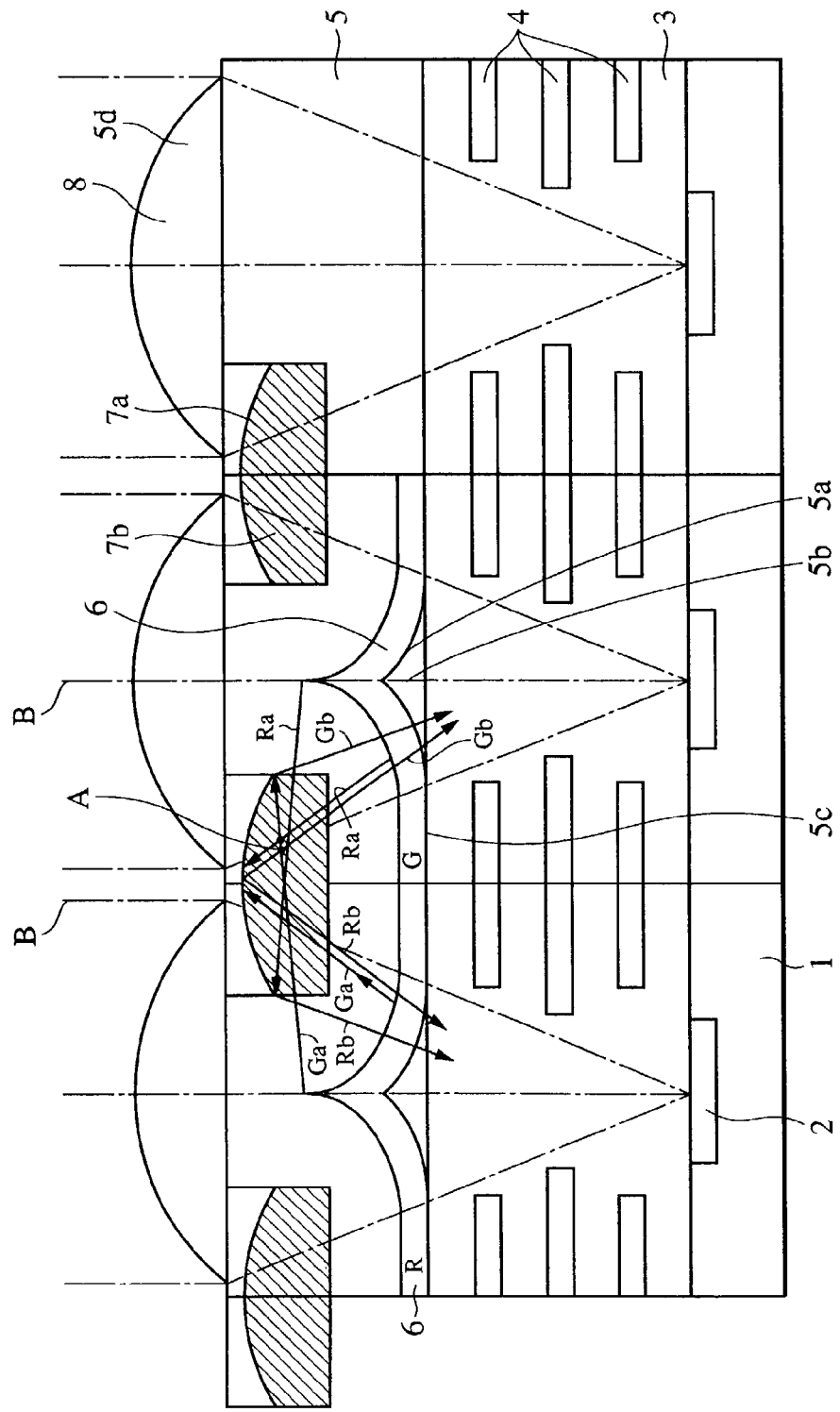
FIG. 2 is a sectional view of the solid-state imaging sensor.

A solid-state imaging sensor and an image pickup apparatus according to preferred embodiments of the present invention will be described with reference to FIGS. 1 to 8. Referring now to FIGS. 1 to 3, a method for fabricating the solid-state imaging sensor and its structure will be described.

FIG. 1 is an enlarged partial view of a solid-state imaging sensor viewed from the light incident direction according to an embodiment of the present invention. FIG. 2 is a sectional view of the solid-state imaging sensor, taken along the line Z–Z' indicated in FIG. 1.

A plurality of photodiodes 2 serving as photoelectric conversion regions, a plurality of gate circuits (not shown), and so forth are two-dimensionally formed on a substrate 1 in the horizontal direction (the X-axis direction) and the vertical direction (the Y-axis direction) in a known manner. A plurality of aluminum wiring layers 4 is formed in a transparent polysilicon layer 3. In order to have a precise, homogeneous desired structure, the polysilicon layer 3 including the aluminum wiring layers 4, transistor switches, and so forth is generally fabricated such that a thin film is formed on the substrate 1 by a thin film forming method such as evaporation or sputtering, a photoresist layer is applied to the thin film, a pattern is formed in the photoresist layer by a mask aligner or the like, portions of the photoresist layer in which the pattern is formed are removed by etching, and the aluminum wiring layers 4 are formed in the removed portions of the photoresist layer, in that order, to complete the first sub-layer of the polysilicon layer 3, and subsequently this step is repeated to form following sub-layers of the polysilicon layer 3, as required, by using a photolithographic process.

A transparent planarizing layer 5 composed of $SiO_2$ or the like is also fabricated step-by-step in the above-described manner by applying the photolithographic processes several times. A first layer for forming curved portions 5a is formed first such that a first planarizing film having an even thickness up to peaks 5b of the curved portions 5a is formed on the polysilicon layer 3, which includes the aluminum wiring layers 4 and is formed on the silicon substrate 1, by evaporation or the like, a photoresist layer is evenly applied to the first planarizing film, and a pattern which will become a precursor of the curved portions 5a is formed in the photoresist layer using a mask aligner or the like, in that order. When the photolithographic process is of a positive type, the photoresist layer is exposed to light by gradually and continuously changing the light exposure, for example, portions of the photoresist layer in the regions facing the peaks 5b are exposed to the largest amount of light and other portions of the photoresist layer in the other regions facing the planarized portions 5c are exposed to the smallest amount of light, and then the unexposed portions of the photoresist layer are removed by an appropriate chemical process.

Figure 3A:
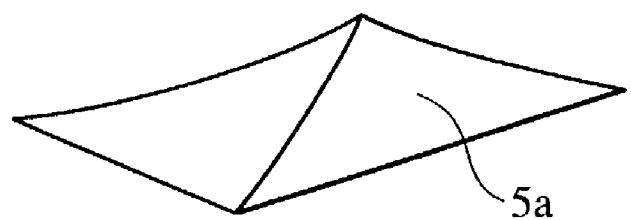
FIG. 3A illustrates a part of a planarizing layer.

In this process, there remain the planarizing film composed of $SiO_2$ and the exposed portions of the photoresist layer having a shape which looks as if each curved portion 5a in FIG. 2 moves in parallel upwardly. In this state, when the exposed portions of the photoresist layer and the planarizing film composed of $SiO_2$ are removed at the same time by applying a dry etching process (i.e., a process for evenly etching the surface of a layer or the like in the depth direction thereof by radiating ions from above), the portions of the first layer where the photoresist layer remains most are removed deeply to substantially the same thickness as that of the photoresist layer and thus form the peaks 5b of the curved portions 5a. Also, the other portions of the first layer where the photoresist layer remains least form the planarized portions 5c. In this state, as shown in FIG. 3A, the curved portions 5a construct a quadrangular pyramid shape having four slanted surfaces, each formed in a concave mirror shape, so as to collect some of the incident light. The curved shape of the curved portion 5a will be discussed later in detail.

In the above described process, the curved portions 5a composed of $SiO_2$ are formed in a repeating pattern above the silicon substrate 1, and then a plurality of dichroic films 6 serving as transmissive portions is deposited on the curved portions 5a. Each dichroic film 6 is an interference film formed of about 10 layers of dielectric material.

As shown in FIG. 1, a group of three kinds of dichroic films, that is, a red film 6a which allows light mainly in the wavelength region of the color red (hereinafter, light in the wavelength region of the color red is referred to as R light) to pass therethrough and which mostly reflects light in the wavelength region of the color green (hereinafter, light in the wavelength region of the color green is referred to as G light) and light in the wavelength region of the color blue (hereinafter, light in the wavelength region of the color blue is referred to as B light), a green film 6b which allows the G light to pass therethrough and which reflects the R light and the B light, and a blue film 6c which allows the B light to pass therethrough and which reflects the R light and the G light, are deposited above the substrate 1 in a repeating pattern.

The method of forming the dichroic films is similar to that of the foregoing curved portions 5a. When a photoresist is uniformly applied to the curved portions 5a, and then the applied photoresist film is exposed to light (except for the portions thereof in which the red films 6a are to be deposited), and is treated by chemical etching, the photoresist layer has openings corresponding to the red films 6a. In this state, the dichroic films, which allow the R light to pass therethrough, are deposited and then the remaining resist film is removed by a chemical process. By forming the green films 6b and the blue films 6c in a similar fashion to that described above, the three kinds of color films are deposited above the substrate 1 in a repeating pattern.

Figure 3B:
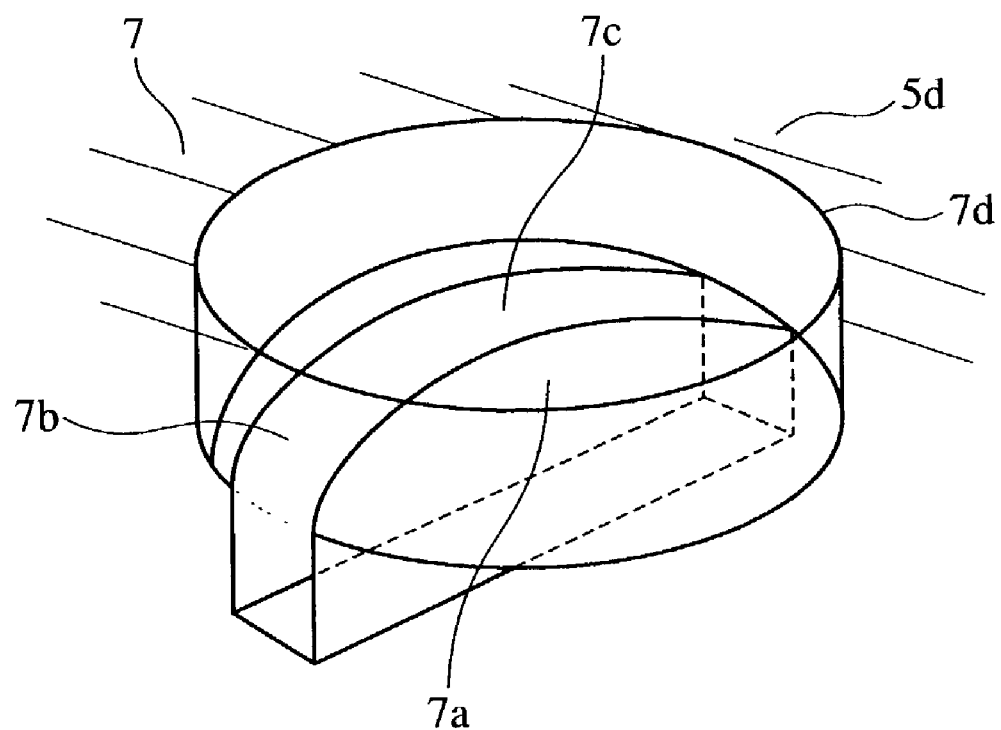
FIG. 3B illustrates a reflector.

Subsequently, in a similar fashion to that described above, a second planarizing film composed of $SiO_2$ is formed again by sputtering up to the upper surfaces 5d of the planarizing layer 5. Then, reflectors 7 are formed in a similar manner of fabrication to that of the curved portions 5a described above. As shown in FIG. 3B, each reflector 7 has a domed mirror 7a having a curved surface expanding toward the light incident direction, a grooved mirror 7b, a roof shaped portion 7c and a countersunk portion 7d, wherein the reflector 7 has a similar configuration as that in which a slotted round head screw is fitted in the countersunk portion 7d.

The slotted groove of the grooved mirror 7b is considerably deep so as to totally reflect the foregoing distributing light at a layer (the second planarizing film), which is composed of $SiO_2$ and has a full mirror structure, the layer having both the roof shaped portion 7c for reflecting the light, which will be described later, and the domed concave mirror 7a for collecting the light. When the reflector 7 is viewed from the solid-state imaging sensor to which light is distributed, half of the domed concave mirror 7a appears to be reflected in the corresponding flat side surface of the grooved mirror 7b lying at the center of the reflector 7.

The reflectors 7, each including the domed mirror 7a and the grooved mirror 7b, are placed at each of the four corners of the microlenses 8, which are arrayed as shown in FIG. 1, that is, at the places where the microlenses 8 are not formed when viewed from the light incident direction. With this arrangement, the reflectors 7 are effectively disposed in optically dead spaces of the solid-state imaging sensor without reducing the effective diameter of each microlens 8 for collecting light.

However, simply disposing domed optical systems, i.e., the reflectors, for reflecting and collecting light at the dead spaces of the four corners of such a pixel causes a problem in that, of the light traveling towards a G pixel placed in the lower center in FIG. 1, a part of the R light and the B light reflected at the corresponding dichroic film 6, and distributed to other pixels, enters another G pixel lying at the upper right in FIG. 1, the light traveling towards the G pixel is not effectively used for information of the R light and B light components. Also, in order to solve the above described problem, when an optical system having a downward domed shape is formed so as to direct the foregoing part of light to the adjacent pixels, the downward domed shape does not fit in the cross shape formed by each of the dead spaces of the microlenses 8, accordingly making the concave mirror for collecting light very small, and thereby resulting in failure to distribute the total reflected light to the adjacent pixels. In view of these problems, according to this embodiment, a solid-state imaging sensor having a structure in which light is reflected three times at a domed reflecting portion and a grooved reflecting portion has been devised.

Each reflector 7 is constructed such that the incident light is reflected so as to change its direction by about 90 degrees, as shown in FIG. 1, and also is reflected into a predetermined direction, as shown in FIG. 2. By reflecting the incident light at a predetermined angle through the two changes of direction shown in FIGS. 1 and 2 in order to satisfy the total reflection condition of the second planarizing film composed of $SiO_2$ that is, in order that light is incident at an angle of about 38 degrees, i.e., at the total reflection angle of the film composed of $SiO_2$ having a refractive index of 1.6, the overall surface of the reflector 7 can be used as the total reflection surface without forming a special film on the surface of the reflector 7. As used herein, total reflection means that the reflection efficiency is 100%, that is, the reflection efficiency is not reduced at all.

After the reflectors 7 are formed, a planarizing treatment is applied (i.e., a thin film composed of an acrylic resin, or the like is formed) on the surface of the planarizing layer 5, and the microlenses 8 are formed in a subsequent process. Firstly, using the pattern shown in FIG. 1 which determines the final shape and the arrangement of the microlenses 8, a surface treatment which is suitable for the acrylic resin serving as the material of the microlenses 8 is performed on the upper surfaces 5d of the planarizing layer 5, then an acrylic thermoplastic resin is evenly applied. Furthermore, a resist is applied, the pattern is formed so as to form cylinders, having axes coinciding with the optical axes of the corresponding microlenses 8, and etching is performed. A cylindrical shape, not a microlens shape, is prepared in this state to form each microlens 8. Subsequently, by melting the acrylic resin in a furnace at a uniform temperature of one hundred to two hundred degrees Celsius, the curved lens shown in FIG. 1 is formed due to the surface tension of the acrylic resin.

Referring again to FIGS. 1 and 2, the movement of light incident on the solid-state imaging sensor will be described.

The light incident toward the silicon substrate 1 through a pickup lens (not shown) converges toward each pixel so as to form an image of an object. Here, of all of the light entering the G pixel placed at the lower center in FIG. 1, about one quarter of the light which passes through the second quadrant of the corresponding microlens 8 will be described. As shown in FIG. 2, the light is refracted at the microlens 8 and is collected in a corresponding photoelectric conversion region 2, in other words, in the corresponding photodiode 2. It is assumed here that the incident light is white light for a better understanding of the movement of the light.

Since the incident light is separated into the wavelength regions at the corresponding dichroic film 6, only the G light, that is, one third of the incident light, passes through the dichroic film 6 toward the corresponding photoelectric conversion region 2, while the R light and the B light, that is, two thirds of the incident light, are reflected at the dichroic film 6 toward the reflector 7 lying at the upper left, as shown by the arrows Ra in FIG. 2. In this state, since the foregoing dichroic film 6 has four concave surfaces for collecting the light, each surface is slanted so as to expand downwardly with respect to the optical axis of the microlens 8, as shown in FIG. 2, the R light and the B light are reflected by the dichroic film 6 toward the reflector 7, and form an intermediate image in the vicinity of the grooved mirror 7b, where the domed mirror 7a is reflected, that is, on the primary imaging plane (A) shown in FIG. 2. Then, the light is collected once again, against the divergence of the light, due to the power of the concave surface of the domed mirror 7a of the reflector 7.

When viewed from the light incident direction as shown in FIG. 1, the light reflected at the corresponding dichroic film 6 travels towards the reflector 7 lying in the slanted upper left direction, then is reflected at the grooved mirror 7b formed in the center of the reflector 7 toward the lower left direction, subsequently is reflected at the domed mirror 7a so as to again travel towards the upper left direction, and is again reflected at the grooved mirror 7b toward an adjacent R pixel. As a result, the light traveling towards the reflector 7 from the corresponding dichroic film 6 is reflected three times and conveyed toward the R pixel lying in the lower left direction as shown by the arrows Rb in FIG. 2.

Since the dichroic film 6 lying above the corresponding R pixel allows the R light to pass therethrough, of the R light and the B light reflected at the foregoing reflector 7, the R light, that is, one third of the light incident on the corresponding microlens 8, is incident on the photoelectric conversion region 2 corresponding to the R pixel. Also, the B light is again reflected at the dichroic film 6, passes through the microlens 8 corresponding to the R pixel, and travels towards the object. As described above, since the remaining light is not kept in the solid-state imaging sensor, but is released outside, the image quality is improved without generating a ghost or a flare. Although, of the light incident on the G pixel, only the light passing through the second quadrant of the microlens 8 has been described so far, the light passing through the fourth quadrant travels in the same but symmetrical manner as that passing through the second quadrant.

Also, of the light incident on the R pixel adjacent to the G pixel in FIG. 1 on the right, the B light and the G light included in the light incident on the first quadrant of the R pixel are reflected at the dichroic film 6 corresponding to the R pixel toward the reflector 7 lying at the upper right, as shown by the arrows Ga in FIG. 2, and form an intermediate image in the vicinity of the grooved mirror 7b where the domed mirror 7a is reflected. Then, the B light and the G light travel towards the adjacent G pixel lying in the lower right direction, as shown by the arrows Gb in FIG. 2, after repetitive reflections. As described above, the B light and the G light incident on the R pixel are incident on the G pixel adjacent to the R pixel on the left after traveling along the reverse path of the R light and the B light incident on the fourth quadrant of the foregoing G pixel. While the G light travels towards the corresponding photoelectric conversion region 2 since the G light passes through the dichroic film 6 for the G pixel, the B light is reflected at the dichroic film 6 and is emitted outside through the microlens 8 for the G pixel.

As described above, a part of the light incident on the G pixel, which is distributed to the adjacent R pixel, and another part of the light incident on the R pixel, which is distributed to the G pixel, are reflected at the common reflector on their traveling paths, thereby allowing the size of the solid-state imaging sensor to be reduced.

Of the white light traveling towards the G pixel placed at the lower center in FIG. 1, the movement of the light passing through the first quadrant of the G pixel will be described next. As described above, while the G light passes through the corresponding dichroic film 6 toward the corresponding photoelectric conversion region 2, the R light and the B light are reflected at the dichroic film 6 and travel towards the other reflector 7 lying at the upper right of the G pixel. This reflector 7 has the same structure as that of the foregoing reflector 7 at the upper left of the G pixel except that it is rotated by 90 degrees. With this arrangement, since the total reflection surface of this reflector 7, having a groove and a curved surface, is aligned in the vertical direction, the R light and B light reflected at this reflector 7 travel towards the B pixel above the foregoing G pixel in FIG. 1. Then, as described above for the R pixel, of the R light and the B light, the B light is incident on the photoelectric conversion region 2 for the B pixel, and the R light is reflected at the corresponding dichroic film 6, passes through the microlens 8 for the B pixel, and is emitted outside toward the object.

When the foregoing movements of light are consolidated, of white light traveling towards the G pixel, only the G light is allowed to pass through the corresponding dichroic film 6, the R light is distributed to the horizontally adjacent R pixels in the drawing, and the B light is distributed to the vertically adjacent B pixels in the drawing, causing these pixels to be exposed to light. In the foregoing process, the B light, which is undesirable in the G pixel and the horizontally adjacent R pixels in which the G light and the R light are needed, respectively, or the R light, which is undesirable in the G pixel and the vertically adjacent B pixels in which the G light and the B light are needed, respectively, is emitted outside toward the object through the R pixels or the B pixels adjacent to the G pixel. This arrangement prevents light in undesirable wavelength regions from entering the other pixels and then becoming a noise source.

Figure 4:
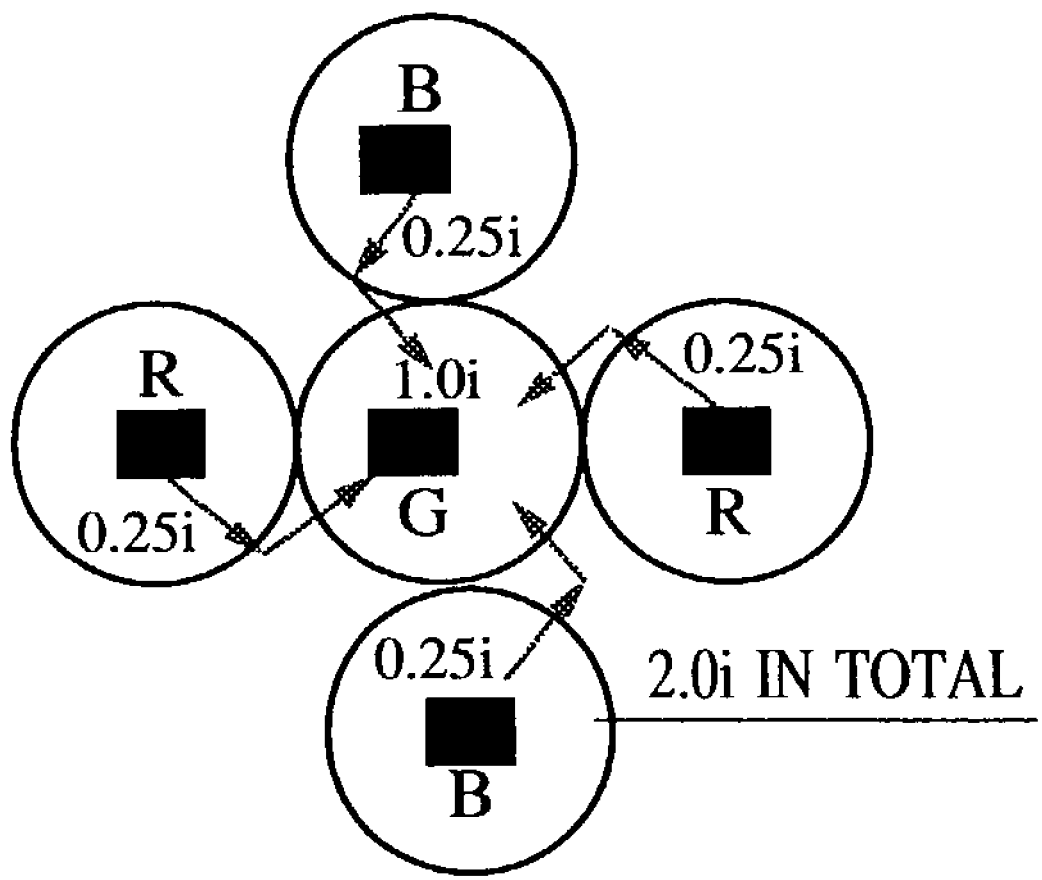
FIG. 4 illustrates the distribution of light to a G pixel from its adjacent pixels.

With the above described movements of light, the light incident on, for example, one G pixel as shown in FIG. 4 gains the G light from its vertically adjacent B pixels and its horizontally adjacent R pixels, that is, gains a quarter of the G light from a quadrant of each of these four pixels. If the amount of the original light incident on the G pixel is given by 1.0i, the G pixel obtains the amount of light (0.25i) from each of the adjacent four pixels, resulting in the total amount of incident light (2.0i), in other words, this increased amount of incident light corresponds to the level of sensitivity raised twice as high as its original level. When compared to two solid-state imaging sensors, one with the foregoing structure, the other without the foregoing structure, the size of the former one can be reduced to the square root of that of the latter one.

Also, with this structure, since a quarter (0.25i) of the amount of light (1.0i) incident on one pixel is distributed to each of its vertically and horizontally adjacent four pixels, or the one pixel gains a quarter (0.25i) of the amount of light (1.0i) from each of its vertically and horizontally adjacent four pixels, the incident light is appropriately distributed, and thus substantially the same advantage as that in which the LPFs are disposed can be achieved without disposing the LPFs for preventing the generation of a false color described in the Related Art. In addition, since the grooved mirrors 7b of the reflectors 7 are arranged in the X-direction and the Y-direction in an alternating and symmetric manner as shown in FIG. 1, for example, one G pixel gains the same amount of light from the X-direction (the vertical direction) and the Y-direction (the horizontal direction), thereby leading to the same advantage as that in which the two LPFs in total are inserted, one in the Y-axis direction and the other in the Y-axis direction. This advantage provides other advantages to the solid-state imaging sensor in which the optical space can be reduced and the cost reduction can be achieved since the expensive LPFs are not needed.

By disposing the reflectors having these advantages and the above described new structure in the dead spaces corresponding to the four corners of each element of the array of the microlenses for collecting light, and also by appropriately designing the shape and the optical power of each reflector, the solid-state imaging sensor is substantially improved without sacrificing the effectiveness of the known microlens.

Figure 5:
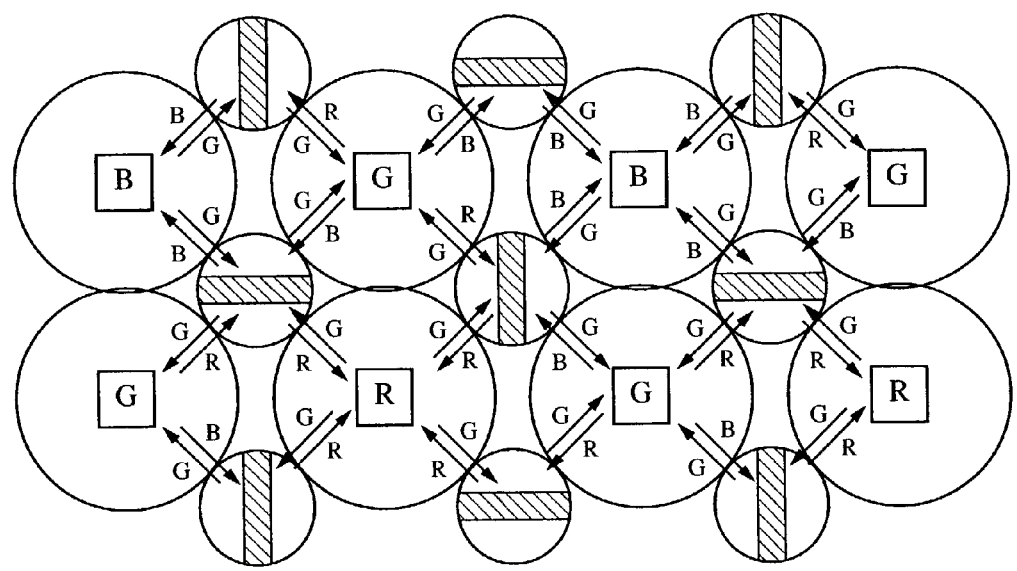
FIG. 5 illustrates the distribution of light among the adjacent pixels.
Figure 6:
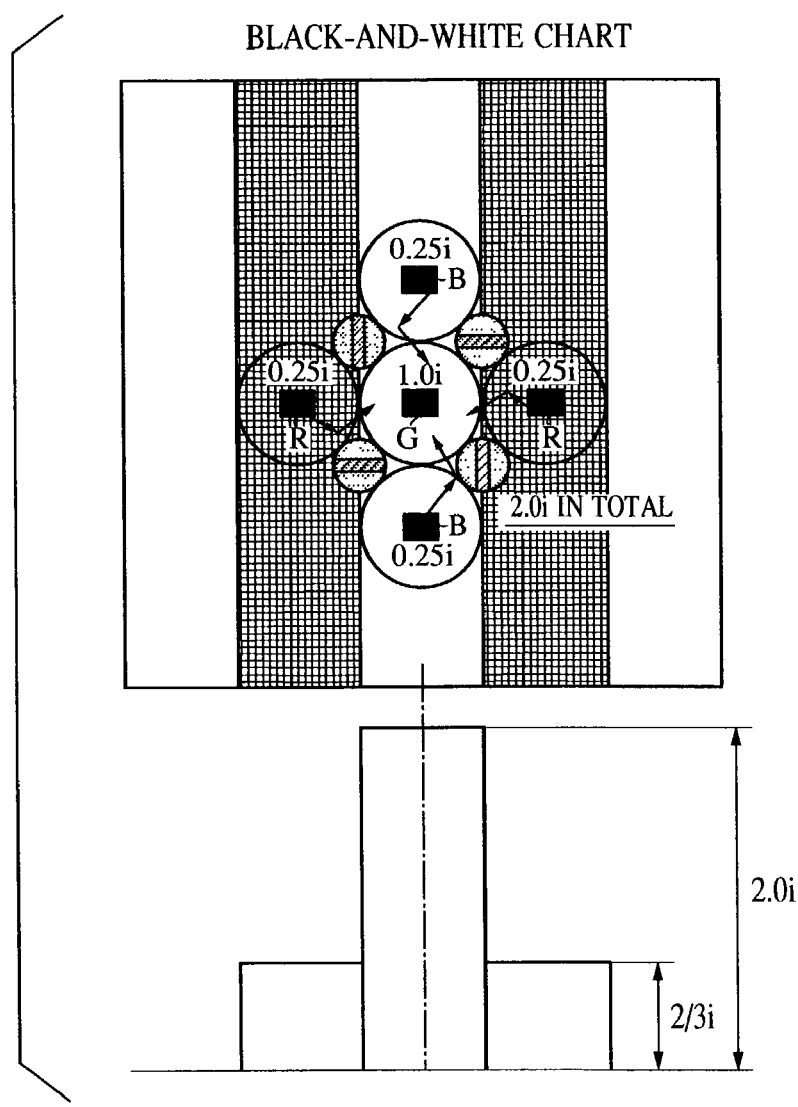
FIG. 6 illustrates the outputs of the solid-state imaging sensor when a bar chart is disposed as an object.
Figure 7:
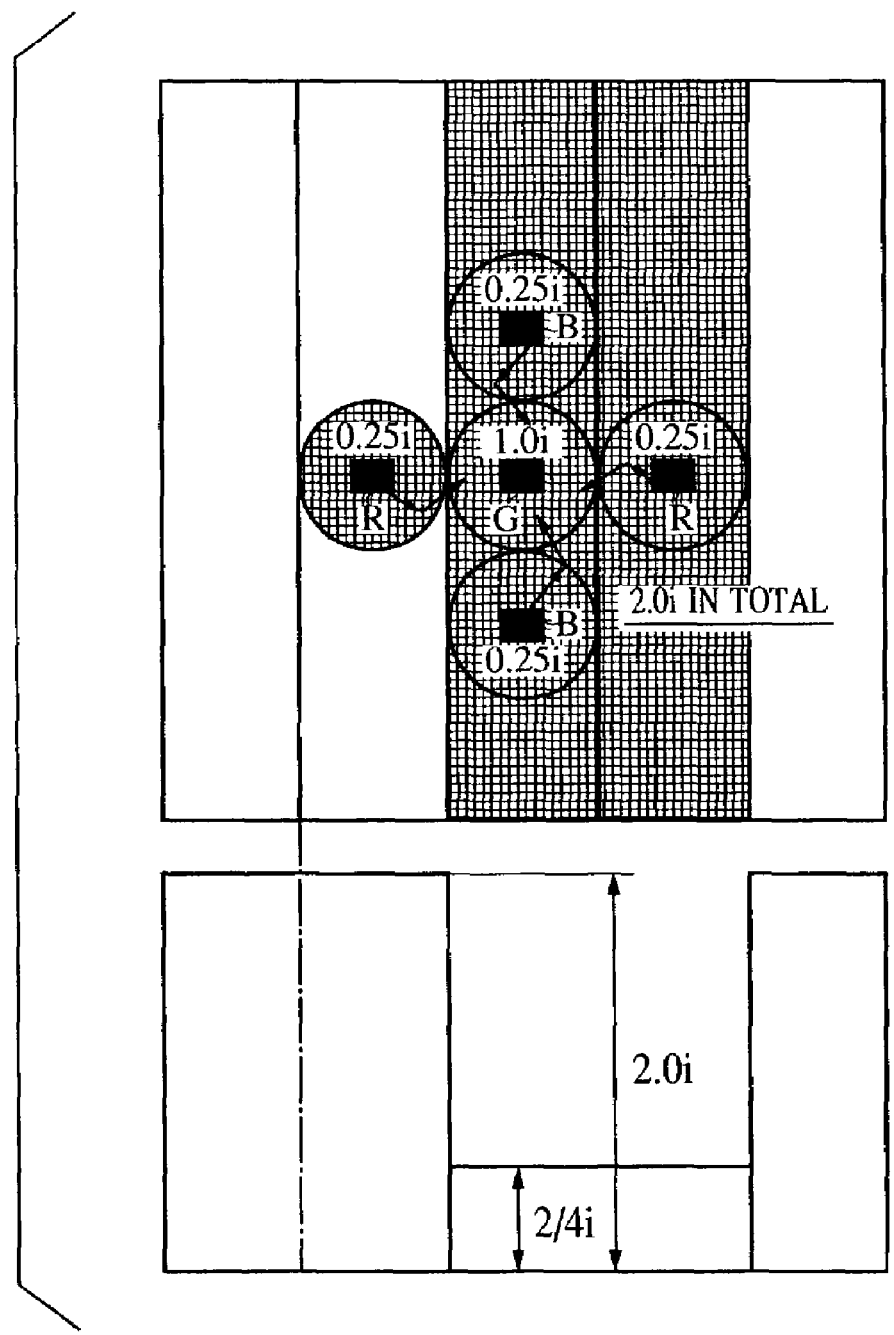
FIG. 7 illustrates the other outputs of the solid-state imaging sensor when another bar chart is disposed as an object.

FIG. 5 illustrates the distributing and collecting states of the light at the R, G, and B pixels. Also, FIGS. 6 and 7 illustrate the outputs of the solid-state imaging sensor when imaging black-and-white bar charts as an object. FIG. 6 illustrates that the black-and-white bar chart has two narrow black bars, and the output of each pixel lying in the white bar is 2.0i while the output of each pixel in the narrow black bar is 2/3i. Also, FIG. 7 illustrates that the black-and-white bar chart has a wide black bar, and the output of each pixel lying in the white bar is 2.0i (the same amount as indicated by FIG. 6) while the output of each pixel in the wide black bar is 2/4i. These results demonstrate that the solid-state imaging sensor according to the present invention provides a sufficient output as an LPF. As described above, the generation of false colors can be prevented and the luminance contrast can be obtained at the same time, thereby achieving good image quality without sacrificing the resolution of the image. In addition, since each reflector 7 is disposed in the vicinity of the primary imaging plane (A) of the image, a compact and effective reflection structure of the reflector 7 can be achieved, thereby leading to the enhanced sensitivity of the solid-state imaging sensor.

The above described structure can be applicable not only to an area-type solid-state imaging sensor but also to a line-type solid-state imaging sensor. The solid-state imaging sensor may be of a CCD type, or of an XY address type using, for example, a CMOS image sensor. The structure can also be applicable to many solid-state imaging sensors having a light collecting function such as a microlens array.

Figure 8:
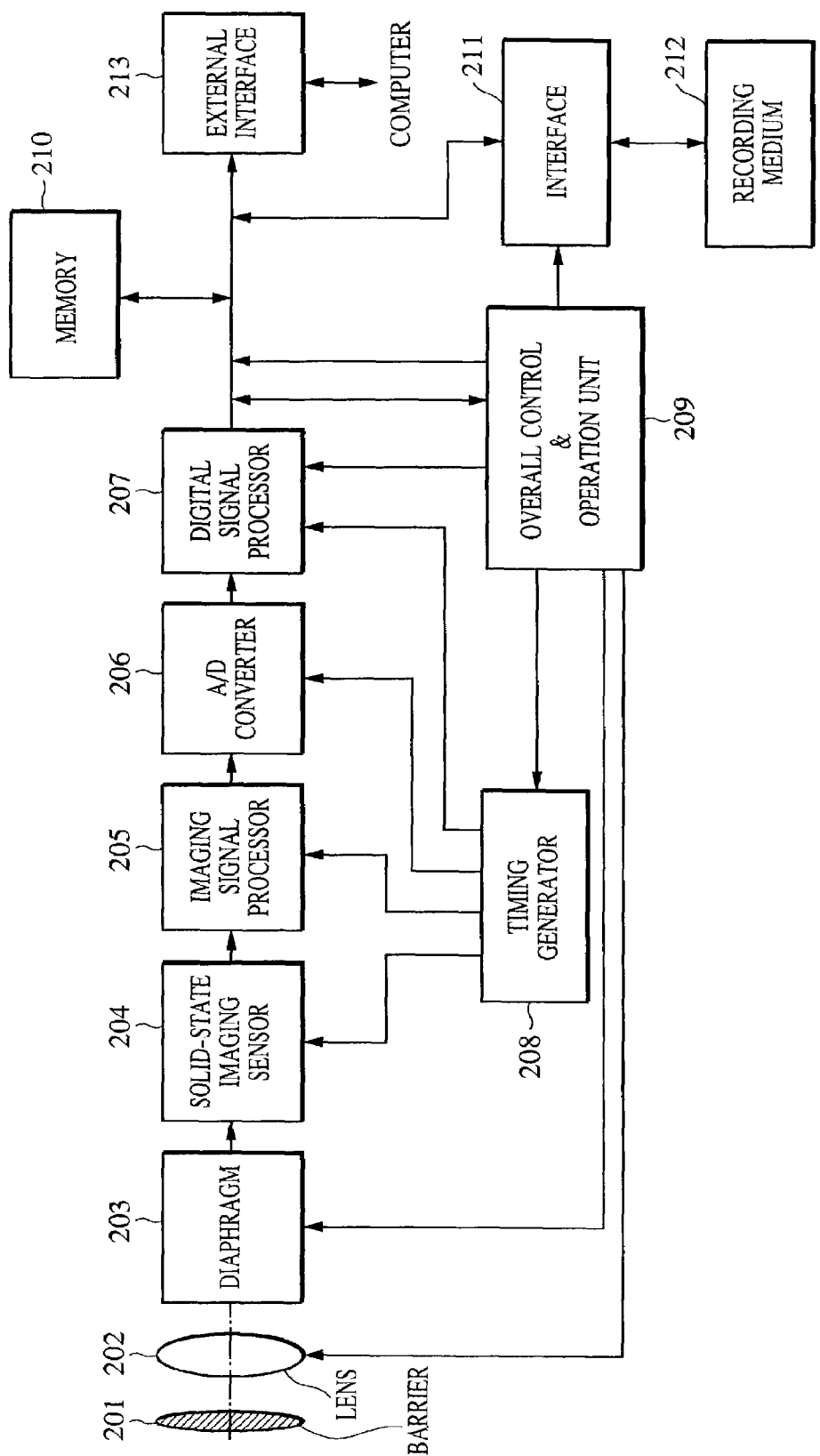
FIG. 8 is a block diagram of an image pickup apparatus.
Figure 9:
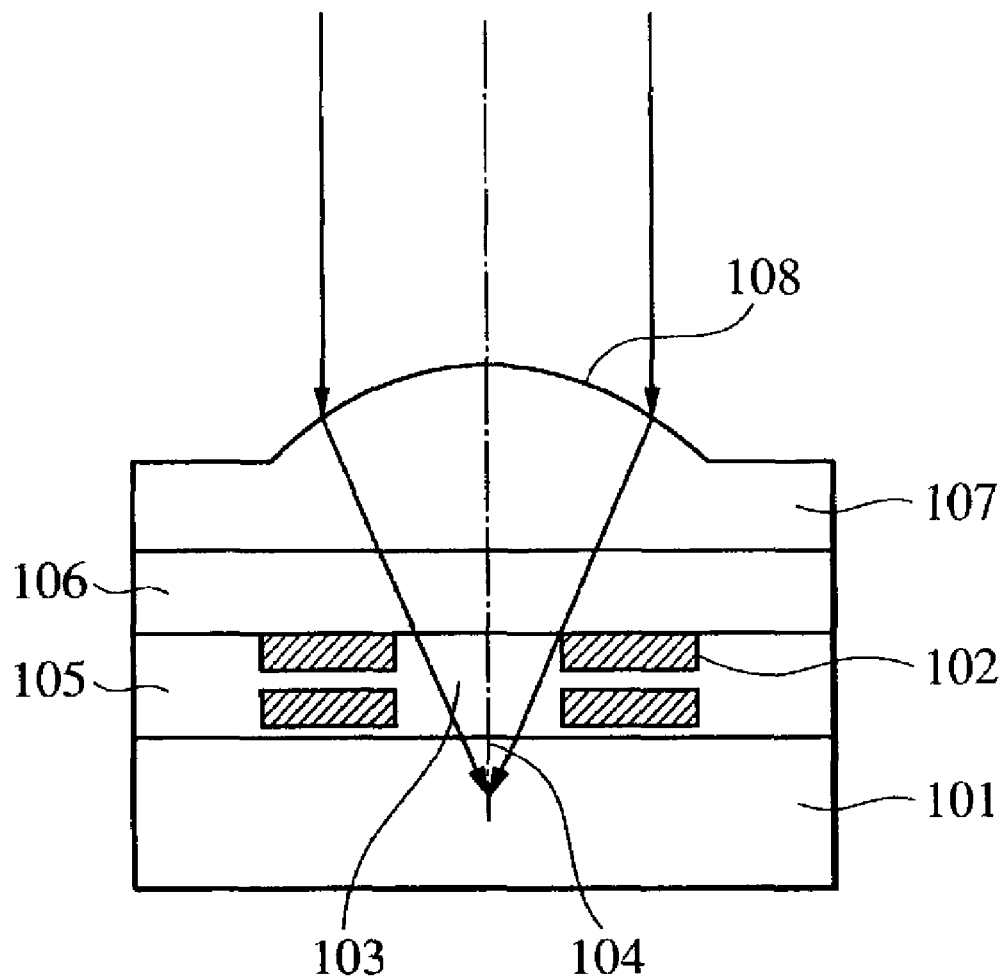
FIG. 9 is a part of a known solid-state imaging sensor.
Figure 10:
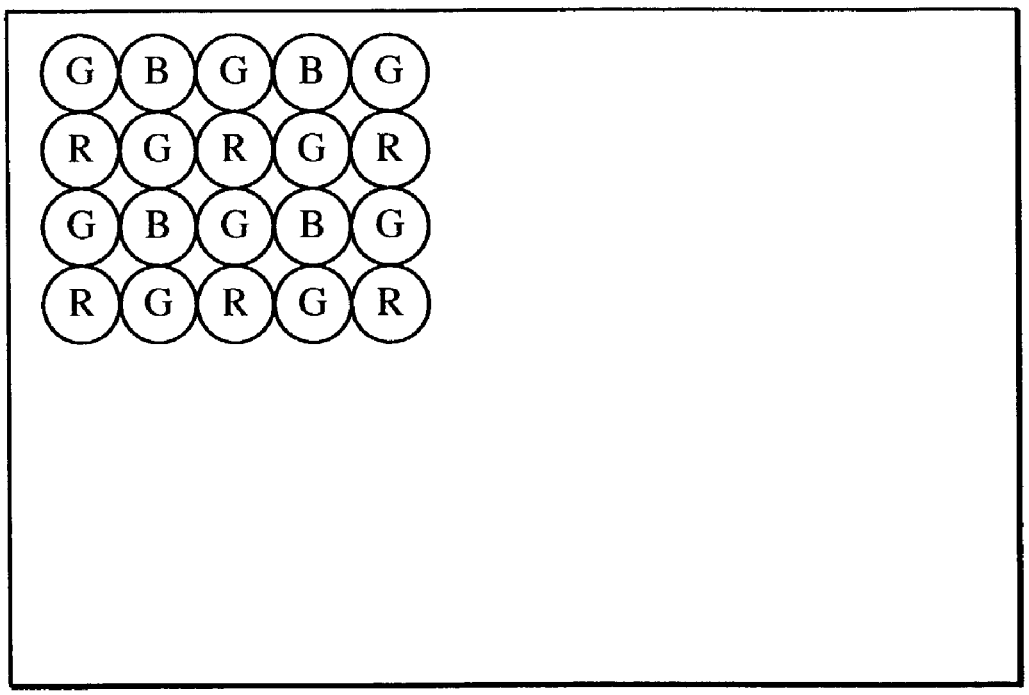
FIG. 10 is a known pixel array of the known solid-state imaging sensor.

Referring now to FIG. 8, an image pickup apparatus (a digital camera) using the solid-state imaging sensor according to the foregoing embodiment will be described.

As shown in FIG. 8, a barrier 201 protects a lens 202 and serves as a main switch, the lens 202 forms an optical image of an object at a solid-state imaging sensor 204, and a diaphragm 203 changes the amount of light passing through the lens 202. The solid-state imaging sensor 204 captures the object image formed at the lens 202 as an image signal and has the structure described above. An imaging signal processor 205 applies predetermined processing to the image signal received from the solid-state imaging sensor 204 and includes a gain-variable amplifier for amplifying the image signal and a gain-correction circuit for correcting the gain set by the gain-variable amplifier.

An A/D converter 206 performs analog-to-digital conversion of the image signal processed by the imaging signal processor 205, and a digital signal processor 207 performs a variety of corrections of digital image data output by the A/D converter 206 or compresses the digital image data. A timing generator 208 outputs a variety of timing signals to the solid-state imaging sensor 204, the imaging signal processor 205, the A/D converter 206, and the digital signal processor 207.

An overall control and operation unit 209 performs various operations and controls the overall still video camera, and a memory 210 temporally stores the image data. A detachable recording medium 212, such as a semiconductor memory, writes in or reads from the image data, an interface 211 allows the detachable recording medium 212 to write in or read from the image data, and an external interface 213 communicates with an external computer or the like.

The operation of the image pickup apparatus having the foregoing structure when an operator photographs an object will be described next. When the barrier 201 is opened by the operator, a main power source is switched on, then a control power source is switched on, and subsequently an imaging power source for the A/D converter 206 and the like is switched on.

Thereafter, the overall control and operation unit 209 opens the diaphragm 203 so as to control the exposure. In this state, the image signal output from the solid-state imaging sensor 204 is converted to digital signals by the A/D converter 206 and then is input into the digital signal processor 207. The overall control and operation unit 209 computes the exposure on the basis of the brightness obtained from the photometric data and controls the diaphragm 203.

Next, the overall control and operation unit 209 extracts high frequency components from the image signal output from the solid-state imaging sensor 204 while controlling the diaphragm 203 and computes the distance to the object, and then determines as to whether the optical system is focused by moving the lens 202. If not affirmative, the overall control and operation unit 209 moves the lens 202 again, computes the distance to the object, and then determines again as to whether the optical system is focused. If affirmative, the actual exposure to light starts.

When the actual exposure to light is completed, the image signal output from the solid-state imaging sensor 204 is processed by the imaging signal processor 205 and then is converted into digital signals by the A/D converter 206. The digital signals are processed by the digital signal processor 207 and then are written in the memory 210 allowed by the overall control and operation unit 209.

Thereafter, the image data stored temporally in the memory 210 is stored in the detachable recording medium 212 such as a semiconductor memory or the like via the interface 211, while being controlled by the overall control and operation unit 209. Alternatively, the image data may be output to an external computer or the like via the external interface 213 and be processed by the external computer. With this configuration, a highly sensitive, compact, and inexpensive image pickup apparatus can be provided.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An image pickup apparatus comprising:
    a plurality of photoelectric conversion regions;
    a plurality of light entrance portions, having spaces therebetween, through which light is incident on the photoelectric conversion regions;
    a plurality of reflectors; and
    at least one light transmissive portion in one of the light entrance portions that allows a part of the light incident thereon to pass therethrough to one of the plurality of photoelectric conversion regions and reflects another part of the light to one of the plurality of reflectors, which reflects the light reflected at the at least one light transmissive portion to another one of the plurality of photoelectric conversion regions,
    wherein, when viewed from a light incident direction, the plurality of reflectors are disposed in the spaces.

2. The image pickup apparatus according to claim 1, further comprising:
    a plurality of said light transmissive portions,
    wherein a light transmissive portion is provided in each said light entrance portion,
    wherein each said light transmissive portion allows a part of the light incident thereon to pass therethrough and reflects another part of the light, and said reflectors reflect the light reflected at the light transmissive portion to other said light entrance portions.

3. The image pickup apparatus according to claim 2, wherein a light-transmissive portion in one of the light entrance portions allows a part of the light, substantially in a first wavelength region, to pass therethrough and reflects another part of the light, in a second wavelength region, which is different from the first wavelength region, and another light-transmissive portion in another one of the other light entrance portions reflects the part of the light in the first wavelength region and allows the part of the light mainly in the second wavelength region to pass therethrough.

4. The image pickup apparatus according to claim 1, wherein each of the reflectors is disposed in the space between the adjacent light entrance portions.

5. The image pickup apparatus according to claim 4, wherein, when viewed from the light incident direction, the plurality of light entrance portions are adjacent to each other in slanted directions.

6. The image pickup apparatus according to claim 1, further comprising a microlens in each light entrance portion.

7. The image pickup apparatus according to claim 1, wherein light is reflected at at least one of the reflectors at an angle of about 90 degrees.

8. The image pickup apparatus according to claim 1, wherein the plurality of light entrance portions are arrayed in X and Y directions, and the plurality of reflectors comprise first reflectors and second reflectors and are configured such that the first and second reflectors are alternately disposed, and wherein each first reflector reflects a part of the light incident on one of the light entrance portions toward one of the other light entrance portions in the X direction adjacent to the one light entrance portion, and each second reflector reflects a part of the light incident on the one light entrance portion towards the one of the other light entrance portions in the Y direction adjacent to the one light entrance portion.

9. The image pickup apparatus according to claim 1, further comprising:

an analog-to-digital converter configured to convert an analog signal from the photoelectric conversion regions into digital signals; and a digital signal processor configured to apply predetermined processing to the digital signals.

* * * * *